(12) United States Patent
Pike (10) Patent No.: US 8,731,120 B1
(45) Date of Patent: May 20, 2014

(54) FEEDBACK-CONTROLLED BIASED INVERTING LIMITER FOR RFI SUPPRESSION

(76) Inventor: Cameron M. Pike, Mount Vernon, OH (US)

( * ) Notice: Subject to any disclaimer, the term of this patent is extended or adjusted under 35 U.S.C. 154(b) by 132 days.

(21) Appl. No.: 13/441,858

(22) Filed: Apr. 7, 2012

Related U.S. Application Data (60) Provisional application No. 61/516,799, filed on Apr. 8, 2011.

(51) Int. Cl.
*H03D 1/04* (2006.01)
(52) U.S. Cl.
USPC ........... 375/346; 375/238; 375/340; 375/350; 455/296; 455/501; 370/205; 329/311; 341/53; 327/551
(58) Field of Classification Search
USPC .......... 375/238, 340, 346, 350; 455/296, 501; 370/205; 329/311; 341/53; 327/551
See application file for complete search history.

(56) References Cited

U.S. PATENT DOCUMENTS 5,160,896 A * 11/1992 McCorkle ...................... 330/251
5,742,900 A    4/1998 Arnstein et al.

* cited by examiner

*Primary Examiner* — Leon Flores
(74) *Attorney, Agent, or Firm* — McKee, Voorhees & Sease, P.L.C.

(57) ABSTRACT

A method and apparatus is provided for reducing interference in a communication system. A feedback-controlled biased inverting limiter is used to reduce interference power by trapping the interfering signal, while passing the wanted signal through to the output. The amplitude trap triples the frequency of a signal component of a particular amplitude, thus shifting it out of the communication band and into the stopband of the receiver or transponder filter. The feedback-controlled biased inverting limiter uses a hard limiter, window comparator, feedback loop, and an exclusive NOR gate to trap the interfering signal, while allowing the wanted signal to pass through to a receiver.

20 Claims, 6 Drawing Sheets

FEEDBACK-CONTROLLED BIASED INVERTING LIMITER FOR RFI SUPPRESSION

CROSS REFERENCE TO RELATED APPLICATIONS

This application claims priority under 35 U.S.C. §119 to commonly owned U.S. provisional patent application Ser. No. 61/516,799 filed on Apr. 8, 2011, entitled "FEEDBACK-CONTROLLED BIASED INVERTING LIMITER FOR RFI SUPPRESSION", which is incorporated by reference herein.

FIELD

The present disclosure relates generally to communication systems, and more specifically, to techniques for reducing interference in communication systems.

BACKGROUND

In various types of communication systems, electromagnetic interference may cause problems with the operation of the communication system. Generally, electromagnetic interference is a disturbance that can affect the operation of a circuit due to electromagnetic induction or electromagnetic radiation emitted from an external source. In a communication system, electromagnetic interference may cause the degradation or loss of data. Exemplary sources of electromagnetic interference include other electronic devices, undesired wireless signals, radio jamming signals, as well as natural phenomenon.

One example of a radio-frequency interference (RFI) suppression technique is described in U.S. Pat. No. 5,742,900 (Arnstein, et al.), which is incorporated by reference herein. In this example, a biased inverting limiter is used to reduce interference. This example requires two signal paths; one path to estimate the amplitude envelope of the interference signal, and a second path to process with the nonlinear biased inverting limiter acting as the "amplitude trap". A carefully calibrated bulk delay line and compensating linear amplifier are required in the second, nonlinear processing path to match the group delay of the control path.

The requirement of a delay element in the nonlinear RF signal path is problematic for implementation, as is the linear booster amplifier to compensate for the attenuation inherent in practical delay elements. In an interference environment, linear amplifiers early in the receiver signal chain are already vulnerable to saturation or undesirable nonlinear effects.

SUMMARY

An apparatus is provided for reducing interference in an input signal, the input signal having a wanted signal and a larger interference signal, the circuit including a hard limiter circuit coupled to the input signal for detecting the polarity of the input signal, a window comparator circuit coupled to the input signal for detecting when the absolute value of the amplitude of the input signal exceeds a threshold value, and generating a pulse-width modulated rectangular wave output signal, a feedback circuit coupled to an output of the window comparator for generating a control signal that controls the duty cycle of the pulse-width modulated rectangular wave output signal, and a logic circuit having a first input coupled to the hard limiter circuit, a second input coupled to the window comparator circuit, and an output, wherein an output signal of the logic circuit includes the wanted signal at a first frequency and the interference signal at a second, higher frequency.

Another embodiment provides a method of reducing interference in an input signal having a wanted signal and an interference signal, the method including detecting the polarity of the interference signal, detecting when the absolute value of the amplitude of the interference signal exceeds a threshold value to generate a pulse-width modulated rectangular wave signal having a frequency higher than the interference signal, using the detected polarity and the generated pulse-width modulated rectangular wave signal to generate an output signal containing the wanted signal at first frequency and the interference signal at a second, higher frequency, and filtering out the second frequency to create a filtered output signal.

Another embodiment provides an RFI suppression system including a hard limiter circuit coupled to an RF input signal, a window comparator circuit coupled to the RF input signal, a feedback circuit coupled to the output of the window comparator for controlling the duty cycle of the output of the window comparator, and a logic circuit having inputs coupled to outputs of the hard limiter and window comparator circuits and having an output coupled to a radio receiver.

Other features and advantages of the present disclosure will be apparent from the accompanying drawings and from the detailed description that follows below.

BRIEF DESCRIPTION OF THE DRAWINGS

The present disclosure is illustrated by way of example and not limitation in the figures of the accompanying drawings, in which like references indicate similar elements and in which.

DETAILED DESCRIPTION

In general, the present disclosure describes a circuit and method for reducing interference in a communication system, such as a wireless communication system. As is described in detail below, a biased inverting limiter RFI suppression system is used which reduces manufacturing and maintenance costs through simplification and self-adaptation of the control path. In one example, an RFI suppression system uses a feedback control path within a biased inverting limiter to achieve various advantages. In one example, an RFI suppression system is used that does not require a separate signal path to derive the biased inverting limiter control parameter, or a delay element and linear booster amplifier in the signal path of the biased inverting limiter. In another example, an RFI suppression system is used that reduces the sensitivity of a biased inverting limiter to implementation variations, environmental factors such as temperature, or effects on the implementation due to aging.

While the system and methods described below may be applied to any desired system that would benefit from interference reduction, the system and methods will be described in the exemplary context of wireless communication systems. For example, the techniques disclosed may be used with wireless communication systems that operate in a high noise environment due to other wireless communication systems, jamming signals, spurious emissions from other electronic equipment, etc.

Generally, a feedback-controlled biased inverting limiter is used to reduce interference power by trapping an interfering signal, while passing a wanted signal through to a receiver. In one example, the amplitude trap increases the frequency of a signal component of a particular amplitude (in one example, tripling the frequency), thus shifting it out of the communication band and into the stopband of the receiver or transponder filter. In one example, the feedback-controlled biased inverting limiter uses a hard limiter, window comparator, and an exclusive NOR gate to trap the interfering signal, while allowing the wanted signal to pass through to the receiver.

Figure 1:
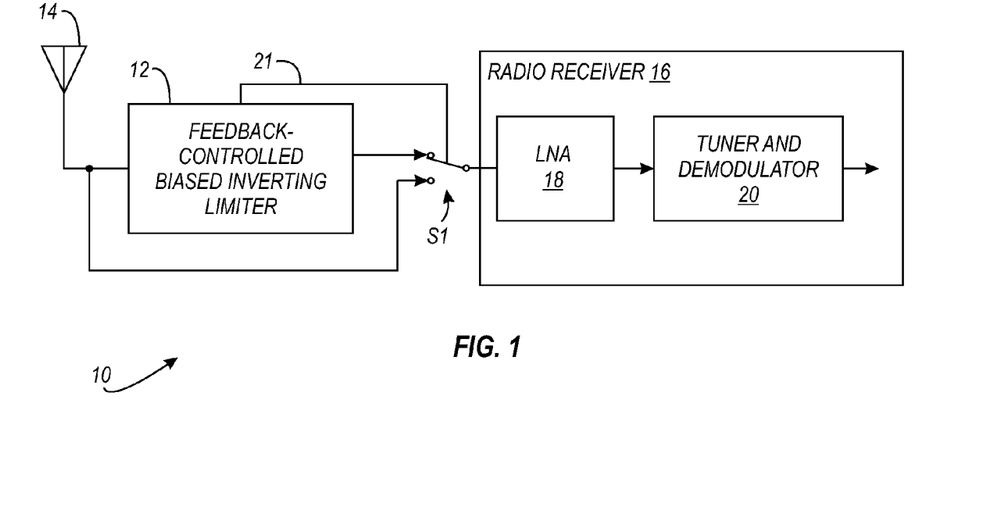
FIG. 1 is a block diagram of an example of an RFI suppression system used with a radio receiver.

FIG. 1 is a block diagram of an example of an RFI suppression system used with a radio receiver. FIG. 1 shows a wireless communication system 10. A feedback-controlled biased inverting limiter 12 (described in detail below) is coupled between an antenna 14 and a radio 16. The radio 16 includes a low noise amplifier (LNA) 18 and a tuner and demodulator 20. For clarity, other conventional components of the radio receiver 16 are not shown, as one skilled in the art would understand. Similarly, FIG. 1 also does not show a transmit path. The feedback-controlled biased inverting limiter 12 suppresses RFI interference, improving the performance of the radio receiver 16. The communication system 10 also includes an optional bypass loop, including one or more RF switch(es) S1, which can be activated to bypass the feedback-controlled biased inverting limiter 12, if desired. In one example, the switch S1 is activated via a control line 21 by the limiter 12, or other controller. For example, if the feedback-controlled biased inverting limiter 12 is being used to suppress RFI from a jamming signal, it may be desirable to bypass the feedback-controlled biased inverting limiter 12 at times when the controller determines that a jamming signal is not present. Of course, other ways of bypassing or disabling the feedback-controlled biased inverting limiter 12 are also possible.

Figure 2:
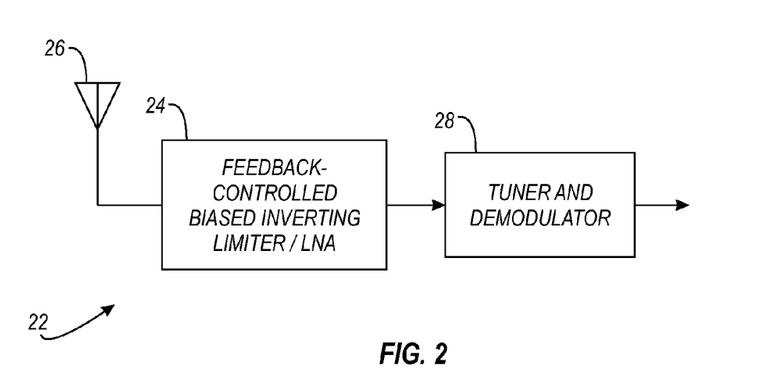
FIG. 2 is a block diagram of an example of an RFI suppression system that is integrated into a radio receiver.

FIG. 2 is a block diagram of an example of an RFI suppression system that is integrated into a radio receiver. FIG. 2 shows a wireless communication system 22. In this example, a feedback-controlled biased inverting limiter (described in detail below) is integrated with an LNA, as shown in block 24. The feedback-controlled biased inverting limiter/LNA 24 is coupled between an antenna 26 and a tuner and demodulator 28. Like before, for clarity, other conventional components of the radio receiver (and transmitter) are not shown, as one skilled in the art would understand. As before, the feedback-controlled biased inverting limiter suppresses RFI interference, improving the performance of the radio receiver. The communication system 22 may also includes a bypass loop similar to that shown in FIG. 1, which can be activated to bypass the feedback-controlled biased inverting limiter, if desired.

Figure 3A:
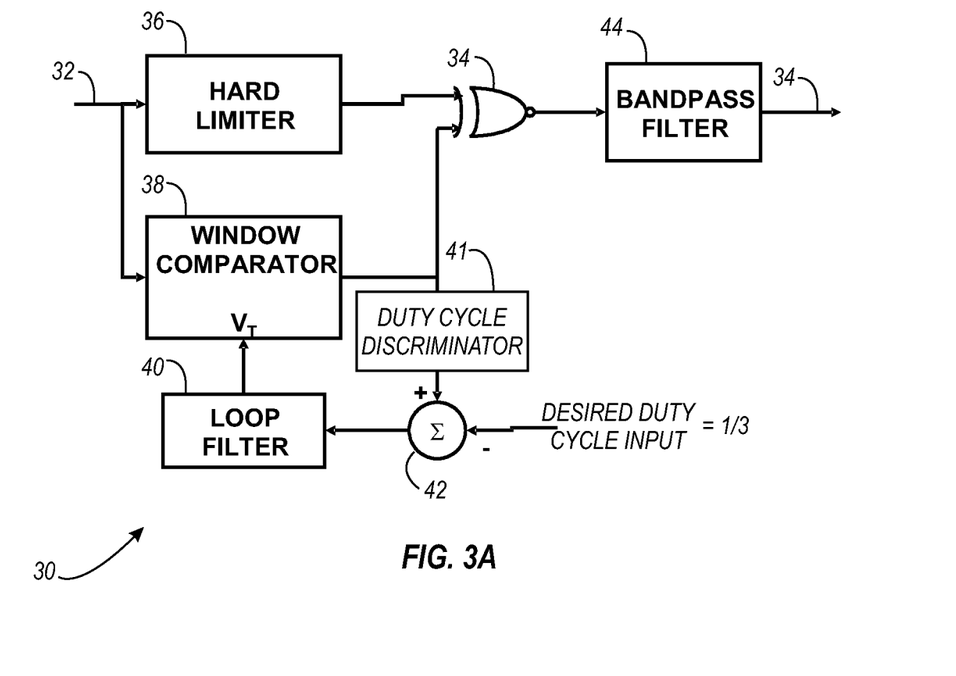
FIGS. 3A and 3B are block diagrams of examples of the feedback-controlled biased inverting limiter shown in FIG. 1.
Figure 3B:
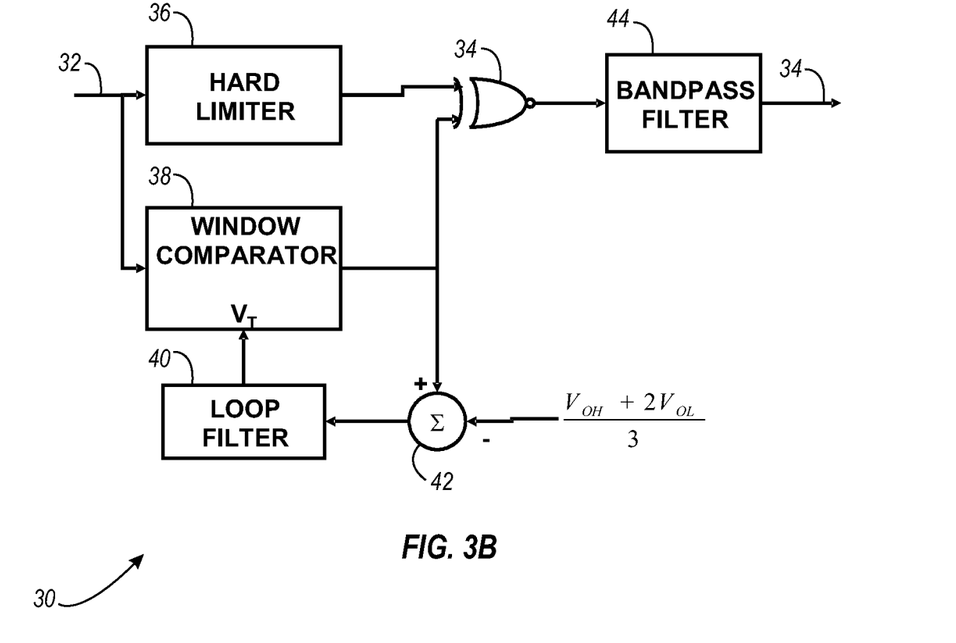

FIGS. 3A and 3B are block diagrams of examples of the feedback-controlled biased inverting limiter shown in FIGS. 1 and 2. FIGS. 3A and 3B each show a feedback-controlled biased inverting limiter 30 having an input 32 and an output 34. In the exemplary implementation shown in FIG. 1, the input 32 would be coupled to the antenna, and the output 34 to the radio receiver.

In these examples, the biased inverting limiter 30 includes an exclusive-NOR gate (XNOR) 34 having two inputs coupled to two comparator circuit elements operating on the RF input signal (at input 32). The RF input signal includes the desired signal, plus interference. A first input of the XNOR 34 is coupled to the output of a hard limiter 36. The hard limiter 36 is a comparator circuit that uses zero for its reference, thus indicating when the input signal has either a positive or negative polarity. The output of the hard limiter 36 is a digital signal that will be high ($V_{OH}$) when the input signal is greater than zero, and low ($V_{OL}$) when the input signal is less than zero.

A second input of the XNOR 34 is coupled to the output of a window comparator 38. The window comparator 38 is a comparator circuit that is a compound comparator in an arrangement known in the art as a window comparator, interval test, or limit comparator. One having ordinary skill in the art may implement this function in a number of ways. In one example, the input voltage is compared with two thresholds, in this example, the thresholds ($V_t$, $-V_t$) are additive inverses of each other. Therefore, the output of the window comparator 38 indicates when the absolute value of the input voltage is greater than the threshold (control) input ($V_t$). FIGS. 3A and 3B also show a loop filter 40, a summing element 42, and a bandpass filter 44 (discussed below).

In the example of FIG. 3A, a duty cycle discriminator 41 is coupled between the output of the window comparator 38 and the summing element 42. The duty cycle discriminator 41 is a circuit that provides an output that is a monotonically increasing function of the duty cycle of the input. In one example, the duty cycle discriminator outputs a DC value that is proportional to the duty cycle of its input. The summing element 42 subtracts the desired duty cycle input (in this example, ⅓) from the output of the duty cycle discriminator 41. As is described in more detail below, the loop filter 40 uses the output of the summing element 42 to generate the appropriate control signal $V_t$. FIG. 3B is an example of one implementation of the circuit shown in FIG. 3A (described below).

Figure 4:
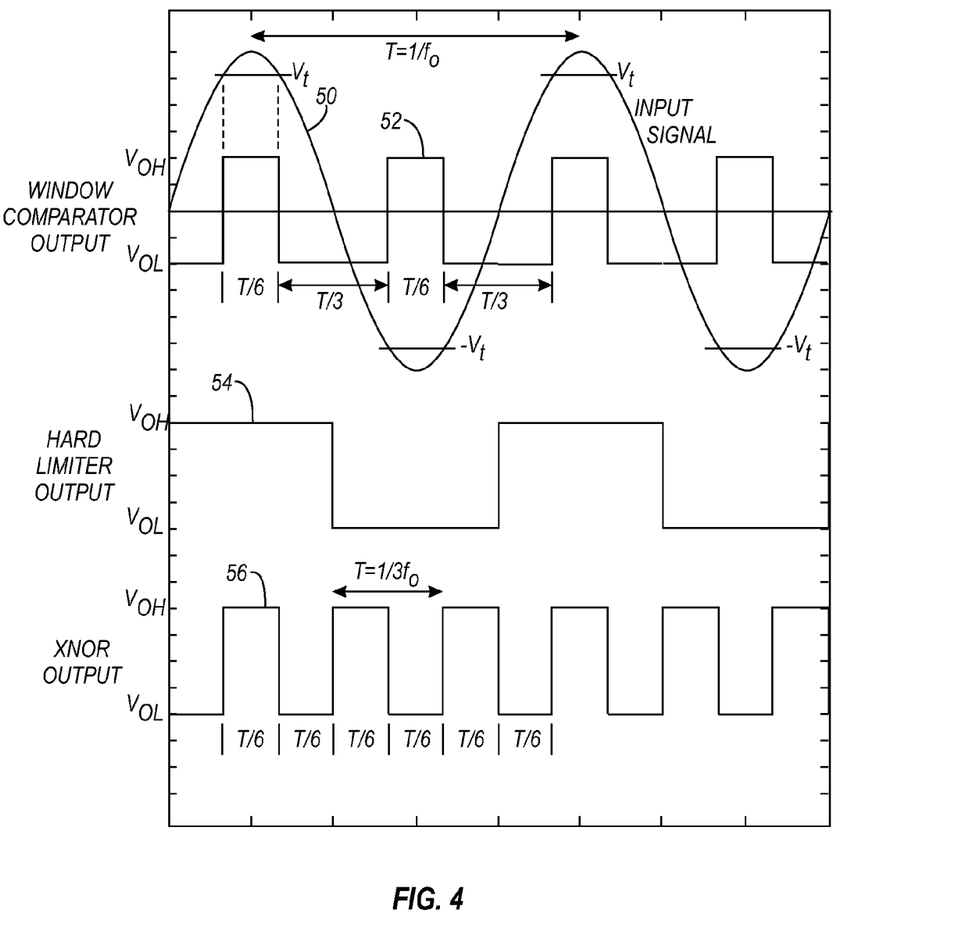
FIG. 4 is a timing diagram showing a typical response to a sinusoidal input signal by the window comparator, hard limiter, and XNOR gate shown in FIG. 3A or 3B.

FIG. 4 is a timing diagram showing a typical response to a sinusoidal input signal by the window comparator, hard limiter, and XNOR gate. As shown in FIG. 4, a sinusoidal input signal 50 having a frequency $f_o$ is present at the input of the window comparator and hard limiter (input 32 in FIG. 3B). Whenever the amplitude of the input signal 50 reaches $+/-V_t$, the output (signal 52) of the window comparator is high. The output is low at other times.

The window comparator 38 can be visualized as converting an input signal of amplitude A at some center frequency $f_o$, to a pulse-width modulated rectangular wave of frequency $2f_o$. The pulse width, or duty cycle, of the rectangular wave output is dependent upon A and $V_t$, and the interaction of other signals and noise in the frequency band. If the input signal is comprised of multiple signals, the fundamental frequency of the window comparator output is twice that of the dominant (largest amplitude) input component.

The output signals of the comparators 36 and 38 are digital, or logic output signals having two states, represented by a high voltage ($V_{OH}$) and a low voltage ($V_{OL}$). The outputs of the hard limiter 36 and the window comparator 38 are combined via the XNOR 34 to produce the desired biased inverting limiter function. Comparators can also be implemented with current outputs rather than voltages: ordinary skill is all that is required to design the system for the appropriate circuit element choices.

Figure 5:
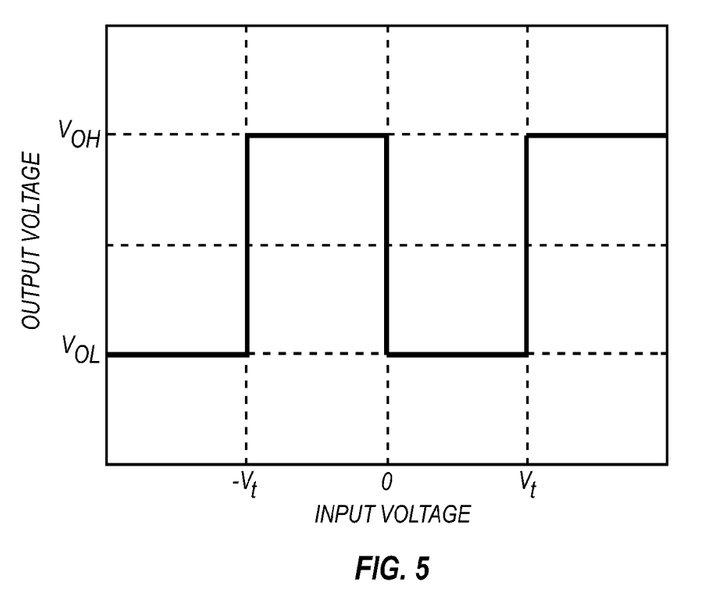
FIG. 5 is an input to output transfer function illustrating the relationship between the output signal and the input of a feedback-controlled biased inverting limiter.

As shown in FIG. 4, the output of the hard limiter (signal 54) is high when the input signal 50 is greater than zero, and is low when the input signal 50 is less than zero. FIG. 4 also shows the output of the XNOR 34 (signal 56). The output of the XNOR 34 will be high whenever its two inputs (signals 52 and 54) are either both high, or both low. A transfer function can also help to illustrate the relationship between the input signal 50 and the output signal 56. FIG. 5 is an input to output transfer function illustrating the relationship between the output signal 56 and the input signal 50. As shown in FIG. 5 (as well as in FIG. 4), the output signal 56 is either high or low, depending on the voltage of the input signal 50.

In this example, the XNOR output signal 56 is a rectangular wave having a frequency of $3f_o$, and a duty cycle dependent on the amplitude A of the input signal and the value of threshold voltage $V_t$. In the example shown in FIG. 4, the control voltage $V_t$ is at an optimal value for suppression of the sinusoidal input signal, that is, the duty cycle of the output of the XNOR is approximately 50%, with a pulse width approximately ⅙ the period T of the input signal.

Figure 6:
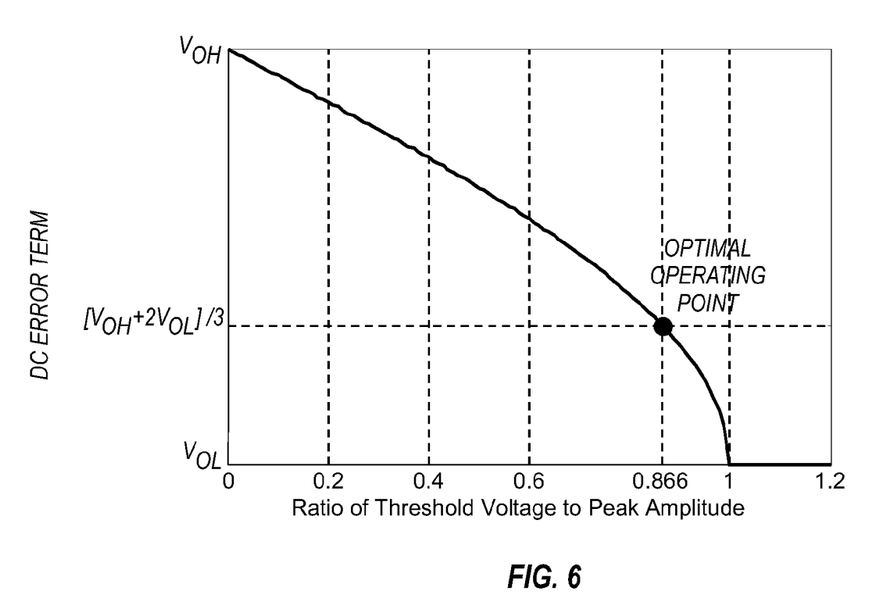
FIG. 6 is a plot of the DC component of the window comparator output as a function of the ratio of threshold control voltage to input signal peak amplitude.

Note that the window comparator 38 produces an output (signal 52 in FIG. 4) with spectral components at baseband (low frequencies including DC), and at even multiples of the input frequency. In particular, the DC value of the output signal varies from $V_{OH}$ to $V_{OL}$ as $V_t$ is varied from 0 to A, the peak amplitude of the input sinusoid, and remains at $V_{OL}$ for $V_t$ greater than A. The relationship follows an arc sine function (equation (1) below), and is represented in the diagram of FIG. 6, which plots the DC component of the window comparator output as a function of the ratio of threshold control voltage to input signal peak amplitude.

$$y(V_t) = V_{OL} + (V_{OH} - V_{OL})\left(1 - \frac{2}{\pi}\arcsin\left(\frac{V_t}{A}\right)\right) \quad (1)$$

Referring to FIGS. 3 and 4, in one example, the technique described above uses the baseband component of the window comparator output 52 as the error term for a feedback control path. As shown in FIG. 3B, the feedback control path comprises the loop filter 40 and the summing element 42. The desired DC value (described below) for optimum RFI suppression is subtracted from the error signal (the output of the window comparator 38) by the summing element 42. The resultant difference is then used as an input to the loop filter 40 to generate the control voltage $V_t$, which is used by the window comparator 38, as illustrated in FIG. 4. The DC level of the window comparator output has a monotonically non-positive slope as a function of $V_t$, thereby ensuring negative feedback stability for positive loop gain.

Conventional control system design techniques can be employed to design the loop filter 40 to meet desired performance goals, such as response time, steady-state error, settling time, percent overshoot, frequency response, etc. The loop filter 40 may be implemented with passive devices, active devices, digital or analog circuitry, as desired.

In one example, the loop filter 40 is implemented with 1) a low-pass filter to isolate the baseband component of the window comparator output, and 2) an ideal integrator to ensure zero DC steady-state error. Furthermore, the control DC value for optimum RFI suppression is selected to cause the window comparator output due to the interfering signal to be asserted for one third (⅓) of the time (i.e. a duty cycle of ⅓). In other words, $V_t$ is set to cause the output of the window comparator 38 to have a pulse width equal to ⅙ of the period of input signal 50, like that shown in FIG. 4. This goal is met when the control DC level is equal to:

$$\frac{V_{OH} + 2V_{OL}}{3}, \quad (2)$$

which is shown in FIG. 3B as an input to the summing element 42 (to be subtracted from the output of the window comparator 38).

Referring again to FIG. 6, this optimal operating point is illustrated by the intersection of the curve and the value of equation (2). The control signal DC level is derived from $V_{OH}$ and $V_{OL}$ for the logic circuits involved. For example, if the output voltages of the window comparator are +3.0 V when the absolute value of the input is greater than the threshold $V_t$, and 0 V otherwise, then the DC control value for optimum RFI suppression is 1.0 V (using equation (2) above).

An examination of the timing diagram of FIG. 4 illustrates how the biased inverting limiter reduces RFI. A periodic input signal with fundamental frequency $f_o$ (signal 50), produces a square wave output (i.e. rectangular wave with 50% duty cycle) with fundamental frequency $3f_o$ (signal 56). The proper duty cycle required to sustain this condition is maintained by the feedback control loop. Bandpass variations of frequency and phase of the signal have no effect on the duty cycle of the signal, and therefore do not diminish the effectiveness of the RFI suppression.

The presence of additional signals at the input of the biased inverting limiter is manifested as variations in the amplitude and phase of the input signal 50, which produce variations in the duty cycle and phase of the output rectangular wave (signal 56). These variations pass through the radio receiver's bandpass filter 44 as the desired signal. They also produce non-DC baseband components in the window comparator 38 output which may be exploited as wanted in the loop filter 40.

Figure 7:
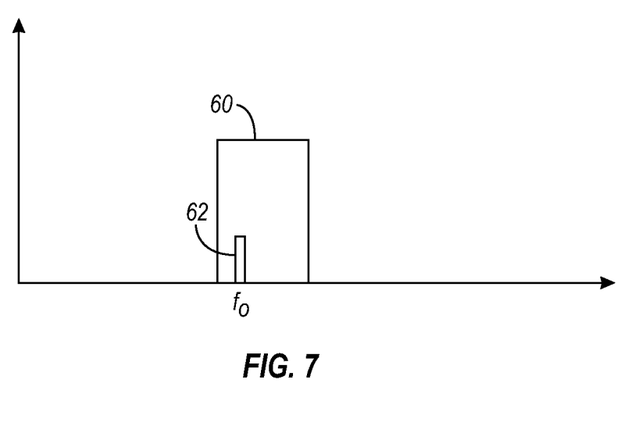
FIGS. 7-9 are exemplary representations of frequency spectrum of the feedback-controlled biased inverting limiter described above.
Figure 8:
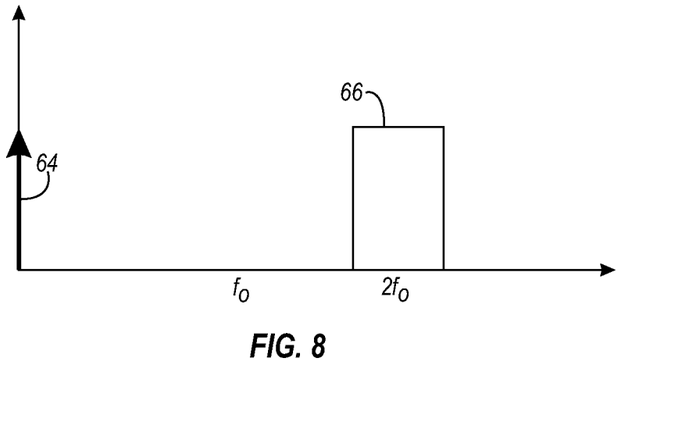
Figure 9:
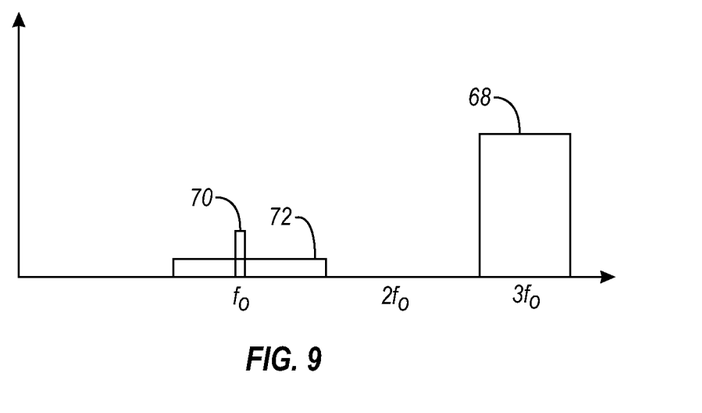

FIGS. 7-9 are exemplary representations of frequency spectra of the feedback-controlled biased inverting limiter described above. FIG. 7 shows an exemplary spectrum of the input of the feedback-controlled biased inverting limiter. FIG. 7 shows phase-modulated interference spectrum 60 and a desired signal spectrum 62 near frequency $f_o$. Without the RFI suppression techniques described above, the interference may make it difficult or impossible to use the desired signal 62. FIG. 8 shows the frequency spectrum at the output of the window comparator 38, which includes a DC component 64 and interference 66 at frequency $2f_o$. FIG. 9 shows the frequency spectrum at the output of the XNOR gate 34. As shown, the interference 68 is centered at $3f_o$, where it will not cause any problems, since it will not pass through the bandpass filter of the receiver. The desired signal 70 is still at $f_o$, along with residual intermodulation interference 72. The residual interference 72 near $f_o$ may not cause any problems, but may be filtered out, if desired.

Thus, the feedback-controlled biased inverting limiter performs RFI mitigation without 1) an envelope detector, 2) a parallel signal path for estimating envelope, or 3) delays and gains associated with an estimation signal path, as are taught in some prior art solutions.

In some examples, the control loop filter 40 may also incorporate nonlinear behavior, such as a control algorithm to autonomously determine if RFI suppression is needed. This may be as simple as another comparator circuit element observing the $V_t$ output of the loop filter 40 presented to the window comparator 38. In this example, the output of the comparator circuit operates an RF switch (for example, switch S1 in FIG. 1) to select an alternate low-noise amplifier (LNA) path, or the RFI suppression path. More complicated algorithms may be implemented in analog circuits, a digital computer or logic, if desired.

In some examples, the hard limiter and XNOR circuits can behave as an LNA for small signal input. In this example, the controller does not permit $V_t$ to go below a certain value, corresponding to an input RF level in which interference power is not harmful. Because the $V_t$ threshold is high enough never to activate the window comparator, the composite input signal is simply amplified by the linear characteristic of the limiter and XNOR circuits.

The circuit described above also allows for self-calibration. To self-calibrate, a test signal can be injected at the biased inverting limiter input 32, while the output is monitored by a computer or signal processing circuit. The computer or signal processing circuit can then adjust the control voltage $V_t$ to cause the test signal to be completely eliminated from the output. This adjustment may be desirable due to age-related drifting of electronic component parameters, or even to permit the use of lower-cost components or methods in the construction of the circuit.

The biased inverting limiter RFI suppression system described above provides numerous benefits. For example, in contrast to some prior art solutions, the need for a separate RFI estimation signal path is obviated. Similarly, the need for a lossy bulk delay element and associated linear gain function are likewise obviated. Manufacturing and age-related variations of circuit elements can be compensated by the feedback loop for more stable performance for the life of the equipment. Well-understood and practiced techniques can be employed in the design of the loop filter in order to achieve desired system behavior goals. Manufacturing and maintenance costs are likewise reduced due to simplification and elimination of delicate elements such as the bulk delay and additional signal analysis path.

Figure 10:
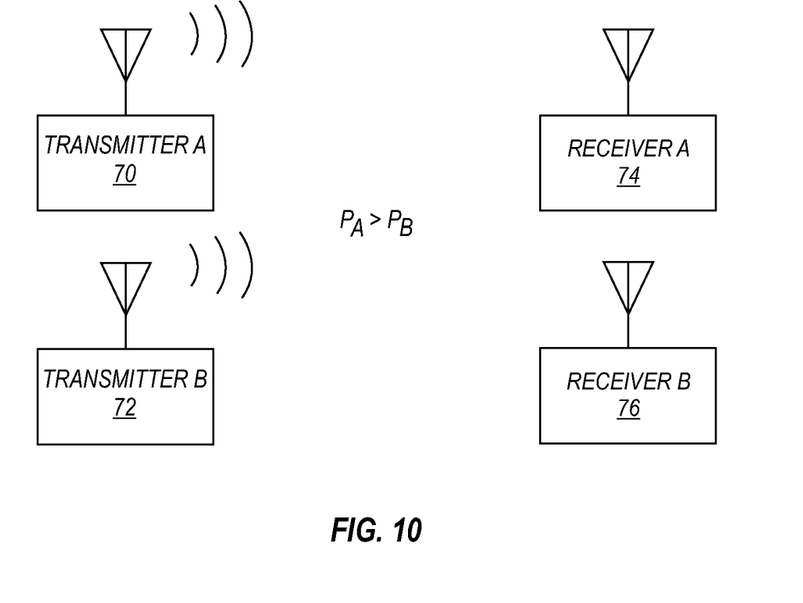
FIG. 10 is a block diagram of a dual-use spectrum system.

As mentioned above, the techniques described may be used with wireless communication systems to deal with RFI due to other wireless communication systems, jamming signals, spurious emissions from other electronic equipment, etc. The biased inverting limiter RFI suppression system described above also enables a related application, a dual-use spectrum system. In such a system, two or more communication systems can simultaneously share a common frequency spectrum. FIG. 10 is a block diagram of an exemplary dual-use spectrum system. In this example, two communication systems operate over the same (or close) frequency spectrum. FIG. 10 shows a first transmitter 70 ("transmitter A") and a second transmitter 72 ("transmitter B"). FIG. 10 also shows corresponding receivers 74 and 76. While both transmitters 70 and 72 operate over the same frequency range, transmitter 70 transmits at a higher power than transmitter 72. Using the techniques described above, each receiver 74 and 76 is able to suppress the unwanted signal, and receive and process the wanted signal.

The receiver 74, which desires to receive the higher power signal A from transmitter 70, can suppress the lower power signal B from the transmitter 72 using a hard limiter, similar to a conventional FM receiver. The receiver 76, which desires to receive the lower power signal B from transmitter 72, can suppress higher power signal A from the transmitter 70 using the feedback-controlled biased inverting limiter described above with respect to FIGS. 1-3. From the perspective of receiver 76, signal A from transmitter 70 is interference. As described above, the feedback-controlled biased inverting limiter is able to suppress the stronger signal A from the transmitter 70, while allowing the receiver 76 to receive and process the desired signal B from transmitter 72. In another example, large and small signals can be combined prior to transmission, analogous to conventional multi-signal transponders, and received separately, as described above.

In the preceding detailed description, the disclosure is described with reference to specific exemplary embodiments thereof. Various modifications and changes may be made thereto without departing from the broader spirit and scope of the disclosure as set forth in the claims. The specification and drawings are, accordingly, to be regarded in an illustrative rather than a restrictive sense.

What is claimed is:

1. A circuit for reducing interference in an input signal, the input signal having a wanted signal and a larger interference signal, the circuit comprising:
    a hard limiter circuit coupled to the input signal for detecting the polarity of the input signal;
    a window comparator circuit coupled to the input signal for detecting when the absolute value of the amplitude of the input signal exceeds a threshold value, and generating a pulse-width modulated rectangular wave output signal;
    a feedback circuit coupled to an output of the window comparator for generating a control signal that controls the duty cycle of the pulse-width modulated rectangular wave output signal, wherein the feedback circuit includes a duty cycle discriminator having an output that is a monotonic function of the duty cycle of its input; and
    a logic circuit having a first input coupled to the hard limiter circuit, a second input coupled to the window comparator circuit, and an output, wherein an output signal of the logic circuit includes the wanted signal at a first frequency and the interference signal at a second, higher frequency.

2. The circuit of claim 1, wherein the feedback circuit further comprises a loop filter.

3. The circuit of claim 2, wherein the feedback circuit further comprises a summing element, wherein the summing element subtracts a constant relating to a desired duty cycle from the output of the duty cycle discriminator circuit.

4. The circuit of claim 1, wherein the hard limiter further comprises a comparator circuit.

5. The circuit of claim 1, wherein the control signal is generated to make the duty cycle of the pulse-width modulated rectangular wave output signal approximately ⅓.

6. The circuit of claim 1, wherein the control signal is generated to make the duty cycle of the pulse-width modulated rectangular wave output signal equal to a desired value based on signal characteristics.

7. The circuit of claim 1, wherein the frequency of the pulse-width modulated rectangular wave output signal generated by the window comparator is double the frequency of the input signal.

8. The circuit of claim 1, wherein the logic circuit comprises an exclusive NOR gate.

9. The circuit of claim 1, wherein second frequency is three times the first frequency.

10. The circuit of claim 1, wherein the hard limiter circuit further comprises a low-noise amplifier (LNA) circuit.

11. A method of reducing interference in an input signal having a wanted signal and an interference signal, the method comprising:
    detecting the polarity of the interference signal;
    detecting when the absolute value of the amplitude of the interference signal exceeds a threshold value to generate a pulse-width modulated rectangular wave signal having a frequency higher than the interference signal;

controlling the duty cycle of the pulse-width modulated rectangular wave signal to achieve a desired duty cycle using a feedback loop, wherein the feedback loop includes a duty cycle discriminator having an output that is a monotonic function of the duty cycle of its input;

using the detected polarity and the generated pulse-width modulated rectangular wave signal to generate an output signal containing the wanted signal at first frequency and the interference signal at a second, higher frequency; and filtering out the second frequency to create a filtered output signal.

12. The method of claim 11, further comprising providing the filtered output signal to a radio receiver.

13. The method of claim 11, wherein the polarity of the interference signal is detected using a hard limiter.

14. The method of claim 11, wherein detecting when the absolute value of the amplitude of the interference signal exceeds a threshold value is accomplished using window comparator.

15. The method of claim 11, wherein the output signal is generated by providing the detected polarity and the pulse-width modulated rectangular wave signal as inputs to an exclusive NOR gate.

16. The method of claim 11, wherein the hard limiter further comprises a low-noise amplifier (LNA) circuit.

17. A radio frequency interference (RFI) suppression system comprising:
a hard limiter circuit coupled to an RF input signal;
a window comparator circuit coupled to the RF input signal;
a feedback circuit coupled to the output of the window comparator for controlling the duty cycle of the output of the window comparator, wherein the feedback circuit includes a duty cycle discriminator having an output that is a monotonic function of the duty cycle of the input; and
a logic circuit having inputs coupled to outputs of the hard limiter and window comparator circuits and having an output coupled to a radio receiver.

18. The RFI suppression system of claim 17, wherein the output of the logic circuit includes a wanted signal at a first frequency and an interference signal at a second, higher frequency.

19. The RFI suppression system of claim 17, wherein the feedback circuit includes a loop filter.

20. The RFI suppression system of claim 17, wherein the hard limiter circuit further comprises a low-noise amplifier (LNA) circuit.

* * * * *